United States Patent
Chen et al.

(10) Patent No.: US 10,637,417 B1
(45) Date of Patent: Apr. 28, 2020

(54) SINGLE CHIP FOR GENERATING MULTIPLE DIFFERENTIAL SIGNALS AND LOOP-THROUGH SIGNALS ACCORDING TO A SINGLE-ENDED RF SIGNAL

(71) Applicant: Rafael Microelectronics, Inc., Hsinchu County (TW)

(72) Inventors: Kuan-Ming Chen, Hsinchu County (TW); Yun-Yi Chen, Hsinchu County (TW); Tzu-Yun Wang, Hsinchu County (TW)

(73) Assignee: Rafael Microelectronics, Inc., Hisnchu County (TW)

( * ) Notice: Subject to any disclaimer, the term of this patent is extended or adjusted under 35 U.S.C. 154(b) by 3 days.

(21) Appl. No.: 16/202,101

(22) Filed: Nov. 28, 2018

(51) Int. Cl.
*H03F 3/68* (2006.01)
*H03F 3/45* (2006.01)
*H03F 3/195* (2006.01)
*H03G 3/30* (2006.01)

(52) U.S. Cl.
CPC ......... *H03F 3/45179* (2013.01); *H03F 3/195* (2013.01); *H03F 3/68* (2013.01); *H03G 3/3042* (2013.01); *H03F 2200/231* (2013.01); *H03F 2200/294* (2013.01); *H03F 2200/451* (2013.01); *H03F 2200/465* (2013.01); *H03F 2200/552* (2013.01); *H03F 2203/45111* (2013.01); *H03G 2201/103* (2013.01)

(58) Field of Classification Search
CPC .......... H03F 3/45; H03F 3/68; H03F 2200/06; H03F 2200/09
USPC ................... 330/124 R, 148, 301; 455/253.2
See application file for complete search history.

(56) References Cited

U.S. PATENT DOCUMENTS

| | | | |
|---|---|---|---|
| 2009/0124223 A1* | 5/2009 | Kyranas | H03C 5/00 455/143 |
| 2015/0236738 A1* | 8/2015 | Kan | H04B 1/123 370/318 |

\* cited by examiner

*Primary Examiner* — Steven J Mottola
(74) *Attorney, Agent, or Firm* — Litron Patent & Trademark Office; Min-Lee Teng

(57) ABSTRACT

A single chip for generating multiple differential signals and loop-through signals according to a single-ended RF signal inputted to the single chip, wherein delays between different channels of the multiple differential signals and loop-through signals can be minimized for supporting picture-in-picture applications; in addition, the single chip can integrate a power detector and an AGC circuit for controlling the gain of an LNA inside the single chip, and the gain of the LNA can be outputted from the single chip for different usages.

8 Claims, 4 Drawing Sheets

SINGLE CHIP FOR GENERATING MULTIPLE DIFFERENTIAL SIGNALS AND LOOP-THROUGH SIGNALS ACCORDING TO A SINGLE-ENDED RF SIGNAL

BACKGROUND OF THE INVENTION

1. Field of the Invention

The invention relates to RF receiver, and in particular, but not exclusively, to an RF receiver for generating multiple differential signals and loop-through signals according to a single-ended RF signal.

2. Description of the Prior Art

Conventionally, multiple chips with external components are connected to generate multiple differential signals and loop-through signals according to a single-ended RF signal, which not only increases the cost and the area of the board space to accommodate the multiple chips and the external components, but also introduces delays among different channels of the differential signals and the loop-through signals, which is not suitable for some applications in which different channels of the differential signals and the loop-through signals need to be synchronized or picture-in-picture images needs to be displayed on a display device.

Therefore, a new solution is needed for generating multiple differential signals and loop-through signals according to a single-ended RF signal.

SUMMARY OF THE INVENTION

One objective of the present invention is to provide a single chip for generating multiple differential signals and loop-through signals according to a single-ended RF signal inputted to the single chip, wherein delays between different channels of the multiple differential signals and loop-through signals can be minimized.

The present invention discloses a single chip for generating multiple differential signals and loop-through signals according to a single-ended RF signal, said single chip comprising: a first amplifier, wherein a first terminal of the first amplifier is coupled to a first pin of the single ship for receiving the first single-ended RF signal, and a second terminal of the first amplifier outputs a second single-ended RF signal according to the first single-ended RF signal; a first single-ended to differential amplifier, wherein a first terminal of the first single-ended to differential amplifier is coupled to the second terminal of the first amplifier, and a second terminal and a third terminal of the first single-ended to differential amplifier outputs a first pair of differential RF signals according to the second single-ended RF signal, wherein the second terminal and the third terminal of the first single-ended to differential amplifier are coupled to a second pin and a third pin of the single ship, respectively; a second single-ended to differential amplifier, wherein a first terminal of the second single-ended to differential amplifier is coupled to the second terminal of the first amplifier, and a second terminal and a third terminal of the second single-ended to differential amplifier outputs a second pair of differential RF signals according to the second single-ended RF signal, wherein the second terminal and the third terminal of the second single-ended to differential amplifier are coupled to a fourth pin and a fifth pin of the single ship, respectively; a second amplifier, wherein a first terminal of the second amplifier is coupled to the second terminal of the first amplifier, and a second terminal of the second amplifier is coupled to a sixth pin of the single chip to output a third single-ended RF signal according to the second single-ended RF signal; and a third amplifier, wherein a first terminal of the third amplifier is coupled to the second terminal of the first amplifier and a second terminal of the third amplifier is coupled to a seventh pin of the single chip to output a fourth single-ended RF signal according to the second single-ended RF signal.

In one embodiment, the first amplifier is an LNA (Low-Noise Amplifier).

In one embodiment, the single chip further comprises a power detector and an AGC (Automatic Gain Control) circuit, wherein a first terminal of the power detector is coupled to the second terminal of the LNA, wherein the AGC circuit automatically controls a gain of the LNA according to an output of the power detector that generates an indication of a power level of the second single-ended RF signal, wherein the gain of the LNA is outputted to at least one eighth pin of the single chip.

In one embodiment, each of the second amplifier and the third amplifier is a buffer with a unity gain.

In one embodiment, the single chip further comprises a power switch for powering on or powering down the signal chip according to a control signal inputted from a ninth pin of the single chip.

In one embodiment, the single chip is connected to an external chip, wherein the external chip receives the first pair of differential RF signals, wherein the least one-eighth pin of the single chip is connected to at least one pin of the external chip.

In one embodiment, the single chip is connected to an external chip, wherein the external chip receives the first pair of differential RF signals, wherein the least one eighth pin of the single chip is connected to at least one pin of the external chip, and the ninth pin of the single chip is coupled to a pin of the external chip that outputs the control signal.

In one embodiment, the single chip is based on a CMOS process.

The detailed technology and above preferred embodiments implemented for the present invention are described in the following paragraphs accompanying the appended drawings for people skilled in this field to well appreciate the features of the claimed invention.

BRIEF DESCRIPTION OF DRAWINGS

The foregoing aspects and many of the accompanying advantages of this invention will become more readily appreciated as the same becomes better understood by reference to the following detailed description when taken in conjunction with the accompanying drawings, wherein.

DETAILED DESCRIPTION OF EMBODIMENT

The detailed explanation of the present invention is described as following. The described preferred embodiments are presented for purposes of illustrations and description, and they are not intended to limit the scope of the present invention.

Figure 1:
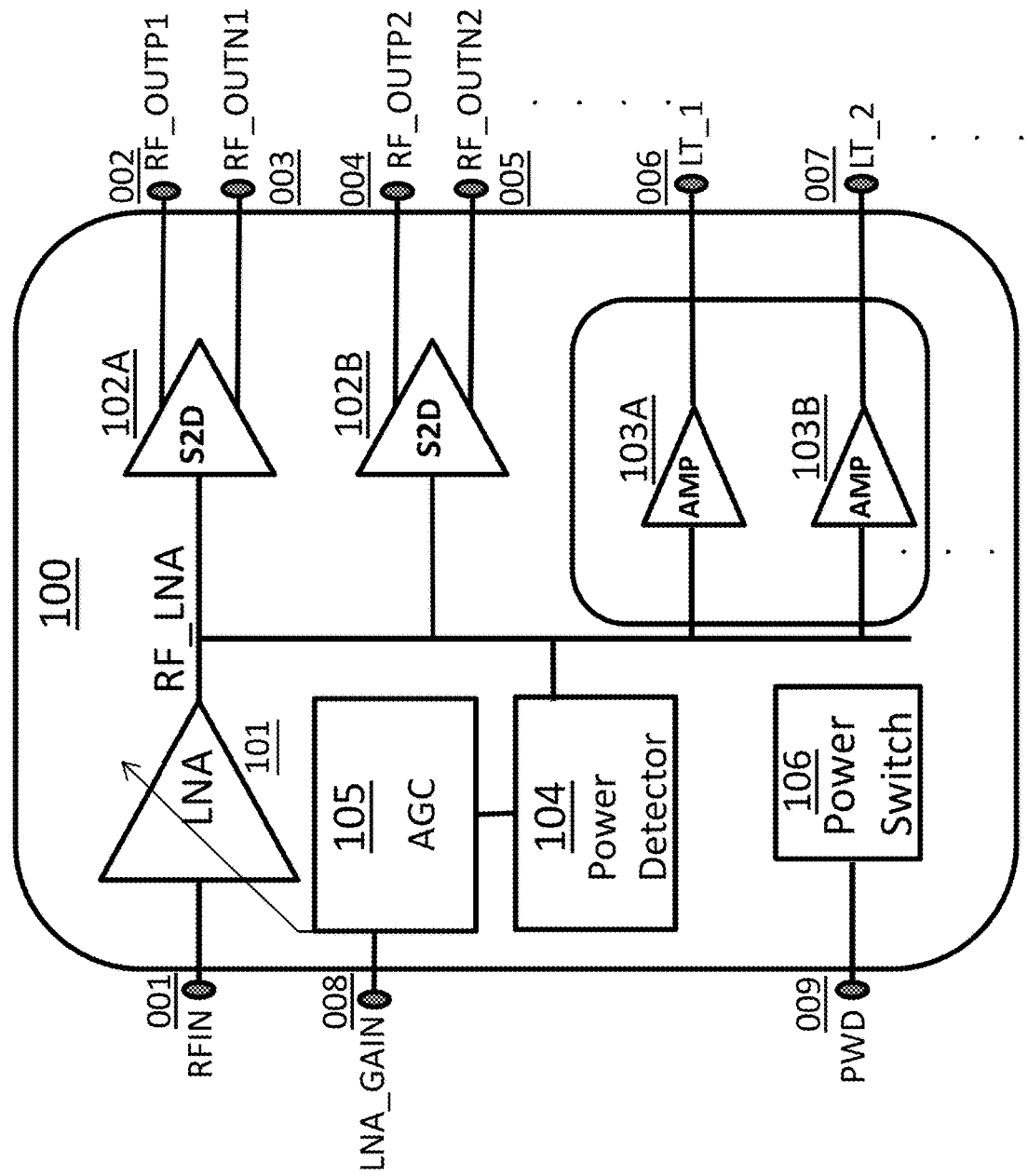
FIG. 1 illustrates a single chip for generating multiple differential signals and loop-through signals according to a single-ended RF signal RFIN in accordance with one embodiment of the present invention.

FIG. 1 illustrates a single chip 100 for generating multiple differential signals and loop-through signals according to a single-ended RF signal RFIN, said single chip 100 comprising: a first amplifier such as an LNA 101, wherein a first terminal of the first amplifier such as the LNA 101 is coupled to a first pin 001 of the single ship 100 for receiving the first single-ended RF signal RFIN, and a second terminal of the first amplifier such as the LNA 101 outputs a second single-ended RF signal RF_LNA according to the first single-ended RF signal RFIN; a first single-ended to differential amplifier 102A, wherein a first terminal of the first single-ended to differential amplifier 102A is coupled to the second terminal of the first amplifier such as the LNA 101 to receive the second single-ended RF signal RF_LNA, and a second terminal and a third terminal of the first single-ended to differential amplifier 102A outputs a first pair of differential RF signals (RF_OUTP1, RF_OUTN1) according to the second single-ended RF signal RF_LNA, wherein the second terminal and the third terminal of the first single-ended to differential amplifier 102A are coupled to a second pin 002 and a third pin 003 of the single ship 100, respectively; a second single-ended to differential amplifier 102B, wherein a first terminal of the second single-ended to differential amplifier 102B is coupled to the second terminal of the first amplifier such as the LNA 101 to receive the second single-ended RF signal RF_LNA, and a second terminal and a third terminal of the second single-ended to differential amplifier 102B outputs a second pair of differential RF signals (RF_OUTP2, RF_OUTN2) according to the second single-ended RF signal RF_LNA, wherein the second terminal and the third terminal of the second single-ended to differential amplifier 102B are coupled to a fourth pin 004 and a fifth pin 005 of the single ship 100, respectively; a second amplifier 103A, wherein a first terminal of the second amplifier 103A is coupled to the second terminal of the first amplifier such as the LNA 101 to receive the second single-ended RF signal RF_LNA, and a second terminal of the second amplifier 103A is coupled to a sixth pin 006 of the single chip 100 to output a third single-ended RF signal LT_1 according to the second single-ended RF signal RF_LNA; and a third amplifier 103B, wherein a first terminal of the third amplifier 105 is coupled to the second terminal of the first amplifier such as the LNA 101 to receive the second single-ended RF signal RF_LNA, and a second terminal of the third amplifier 103B is coupled to a seventh pin 007 of the single chip 100 to output a fourth single-ended RF signal LT_2 according to the second single-ended RF signal RF_LNA.

In one embodiment, the single chip 100 generates more than two pairs of differential signals according to the single-ended RF signal RFIN.

In one embodiment, the single chip 100 generates more than two loop-through signals according to the single-ended RF signal RFIN.

In one embodiment, the single chip 100 generates more than two pairs of differential signals and more than two loop-through signals according to the single-ended RF signal RFIN.

In one embodiment, each of the second amplifier 103A and the third amplifier 103B is a buffer with a unity gain.

In one embodiment, the single chip 100 is based on a CMOS process.

In one embodiment, the single chip 100 further comprises a power detector 104 and an AGC circuit 105, wherein the power detector 104 is coupled to the second terminal of the LNA 101 that outputs the second single-ended RF signal RF_LNA, wherein the AGC circuit 105 automatically controls a gain of the LNA 101 according to an output of the power detector 104 that generates an indication of a power level of the second single-ended RF signal RF_LNA, wherein the gain of the LNA 101 LNA_GAIN is outputted to at least one eighth pin 008 of the single chip 100.

In one embodiment, the single chip 100 further comprises a power switch 106 for powering on or powering down the signal chip 100 according to a control signal PWD inputted from a ninth pin 009 of the single chip 100.

Figure 2:
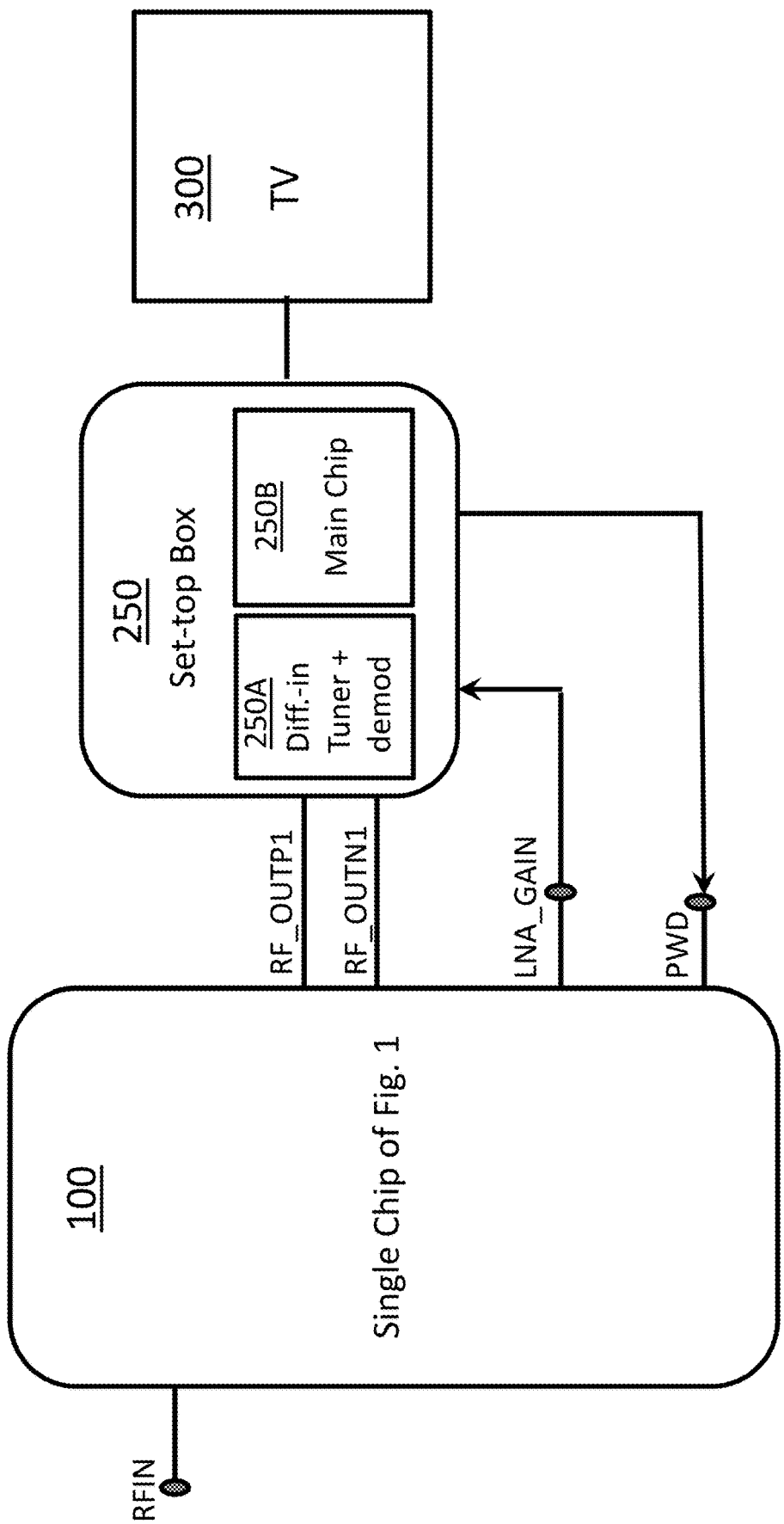
FIG. 2 illustrates an exemplary application of the single chip in FIG. 1 in accordance with one embodiment of the present invention.

In one embodiment, FIG. 2 illustrates a schematic in which the single chip 100 is connected to a set-top box 250 to generate video signals to a television (TV) 300 via an interface such as HDMI, wherein the set-top box 250 comprises a front-end block or chip 250A comprising a differential signals receiver, a tuner and a demodulator, and a main chip 250B, wherein the front-end block or chip 250A receives the first pair of differential RF signals (RF_OUTP1, RF_OUTN1) and performs tuning and demodulation based on the received first pair of differential RF signals (RF_OUTP1, RF_OUTN1), wherein the gain of the LNA 101 LNA_GAIN is outputted from the single chip 100 to the main chip 250B, so that the main chip 250B can use the LNA_GAIN for obtaining information related to the RSSI of the inputted single-ended RF signal RFIN for controlling the parameters in the front-end block or chip 250A to achieve better performance. In one embodiment, the main chip 250B outputs a control signal PWD to single chip 100 for powering on or powering down the signal chip 100, so that there is no need to have an external power switch for saving area of the board as well as the cost of the external power switch.

Figure 3:
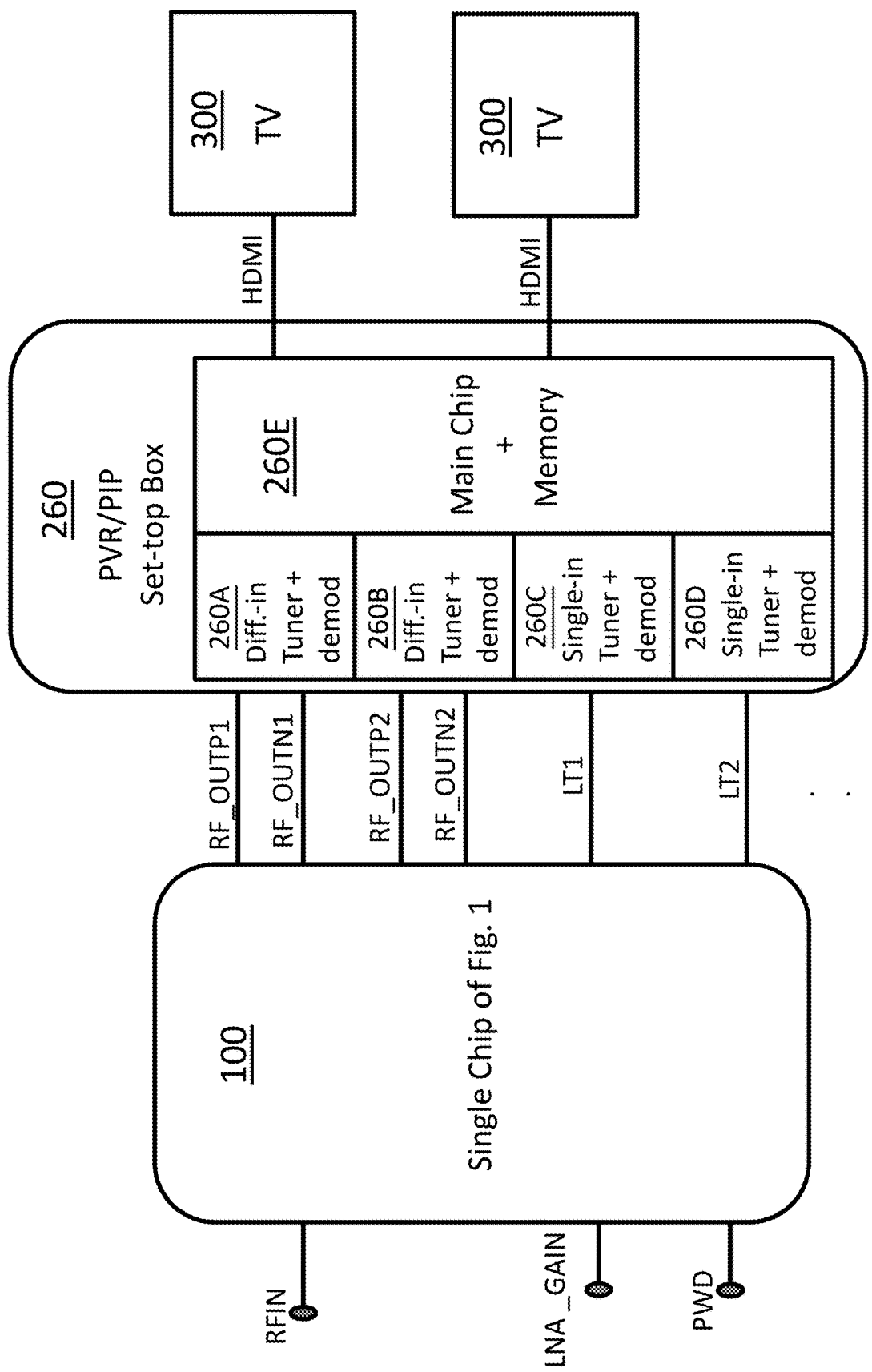
FIG. 3 illustrates another exemplary application of the single chip in FIG. 1 in accordance with one embodiment of the present invention.

In one embodiment, FIG. 3 illustrates a schematic in which the single chip 100 is connected to a PVR/PIP (Picture-in-Picture) set-top box 260 to generate video signals to each television (TV) 300 via an interface such as HDMI, wherein the set-top box 260 contains two front-end chips or blocks 260A, 260B each containing differential signals or single-ended signal receiver, a tuner and a demodulator, wherein a main chip 260E is used to interface with the front-end chips or blocks 260A, 260B for generating multiple channels of video signals to televisions (TV) 300, wherein the front-end chip or block 260A receives the first pair of differential RF signals (RF_OUTP1, RF_OUTN1) and performs tuning and demodulation based on the received first pair of differential RF signals (RF_OUTP1, RF_OUTN1), the front-end chip or block 260B receives the second pair of differential RF signals (RF_OUTP2, RF_OUTN2) and performs tuning and demodulation based on the received second pair of differential RF signals (RF_OUTP2, RF_OUTN2), the front-end block 260C receives the single-ended signal LT_1 form the single chip 100 and performs tuning and demodulation based on the received single-ended signal LT_1, the front-end block 260D receives the single-ended signal LT_2 form the single chip 100 and performs tuning and demodulation based on the received single-ended signal LT_2. As shown in FIG. 3, two televisions (TV) 300 are connected to the PVR/PIP set-top box 260, and the PVR/PIP set-top box 260 can produce picture in picture images on each TV 300, for example, the front-end block 260A and front-end block 260B can select two video programs, and the main chip 260B can combine these two video programs and send the combined video programs to a TV 300; alternatively, the front-end block 260A and front-end block 260C can select two video programs and the main chip 260B can combine these two video programs and send the combined video programs to a TV 300.

Figure 4:
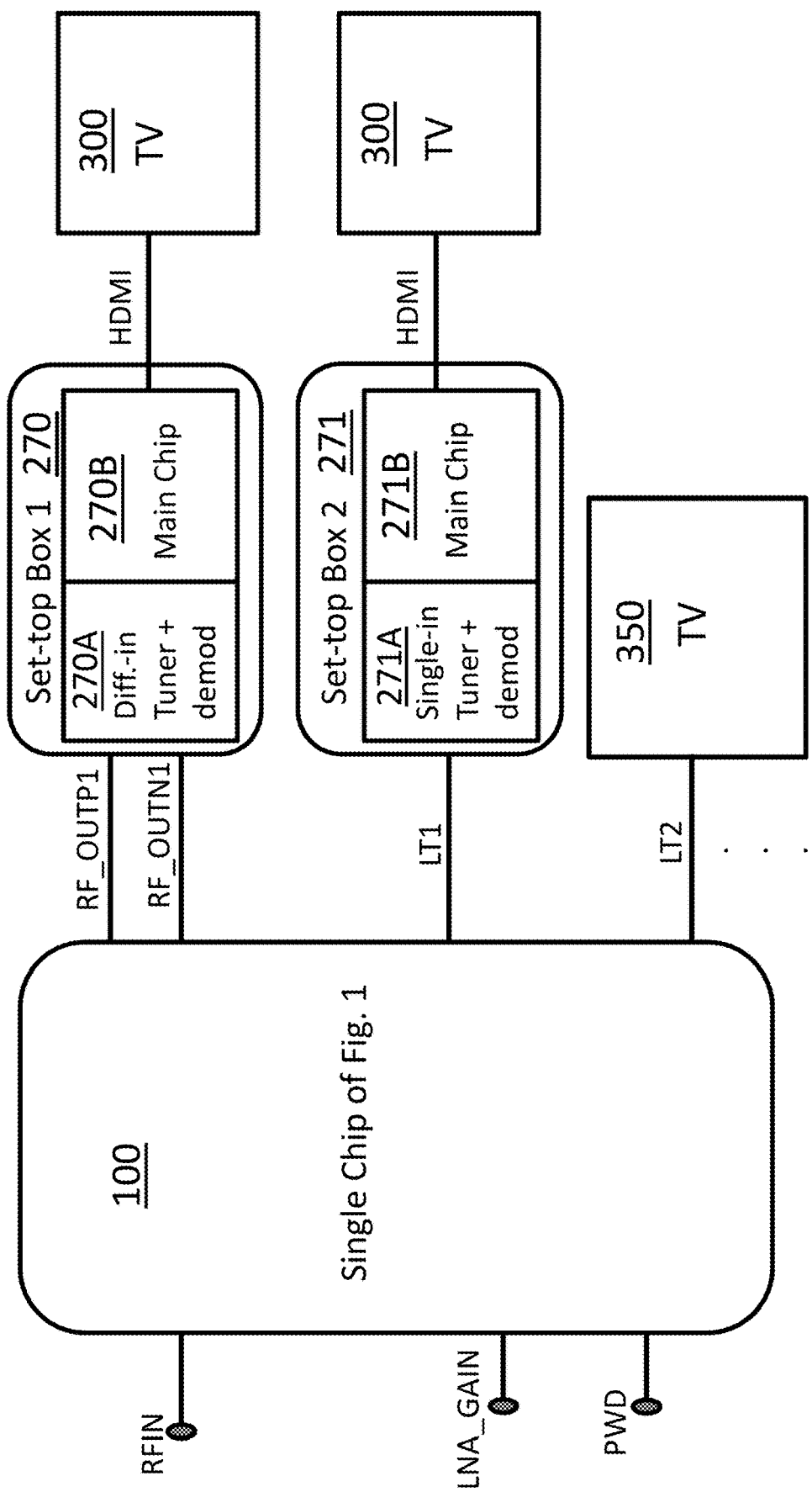
FIG. 4 illustrates yet another exemplary application of the single chip in FIG. 1 in accordance with one embodiment of the present invention.

In one embodiment, FIG. 4 illustrates a schematic in which the single chip 100 is connected to a set-top box 270 containing a front-end chip 270A and a main chip 270B and a set-top box 271 containing a front-end chip 271A and a main chip 271B for generating video signals to each television (TV) 300 via an interface such as HDMI, wherein the front-end block or chip 270A comprises a differential signals receiver, a tuner and a demodulator, wherein the front-end block or chip 270A receives the first pair of differential RF signals (RF_OUTP1, RF_OUTN1) and performs tuning and demodulation based on the received first pair of differential RF signals (RF_OUTP1, RF_OUTN1), the front-end block or chip 271A receives a single-ended signal LT_1 form the single chip 100 and performs tuning and demodulation based on the received single-ended signal LT_1, and the single chip 100 can send a single-ended signal LT_2 directly to a TV 350 which has built-in tuner and demodulator for generating video signal inside the TV 350.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the claims appended hereto and their equivalents.

What is claimed is:

1. A single chip for generating multiple differential signals and loop-through signals according to a single-ended RF signal, said single chip comprising:
    a first amplifier, wherein a first terminal of the first amplifier is coupled to a first pin of the single chip for receiving the first single-ended RF signal, and a second terminal of the first amplifier outputs a second single-ended RF signal according to the first single-ended RF signal;
    a first single-ended to differential amplifier, wherein a first terminal of the first single-ended to differential amplifier is coupled to the second terminal of the first amplifier to receive the second single-ended RF signal, and a second terminal and a third terminal of the first single-ended to differential amplifier outputs a first pair of differential RF signals according to the second single-ended RF signal, wherein the second terminal and the third terminal of the first single-ended to differential amplifier are coupled to a second pin and a third pin of the single chip, respectively;
    a second single-ended to differential amplifier, wherein a first terminal of the second single-ended to differential amplifier is coupled to the second terminal of the first amplifier to receive the second single-ended RF signal, and a second terminal and a third terminal of the second single-ended to differential amplifier outputs a second pair of differential RF signals according to the second single-ended RF signal, wherein the second terminal and the third terminal of the second single-ended to differential amplifier are coupled to a fourth pin and a fifth pin of the single chip, respectively;
    a second amplifier, wherein a first terminal of the second amplifier is coupled to the second terminal of the first amplifier to receive the second single-ended RF signal, and a second terminal of the second amplifier is coupled to a sixth pin of the single chip to output a third single-ended RF signal according to the second single-ended RF signal; and
    a third amplifier, wherein a first terminal of the third amplifier is coupled to the second terminal of the first amplifier to receive the second single-ended RF signal, and a second terminal of the third amplifier is coupled to a seventh pin of the single chip to output a fourth single-ended RF signal according to the second single-ended RF signal.

2. The single chip of claim 1, wherein the first amplifier is an LNA.

3. The single chip of claim 2, further comprising a power detector and an AGC circuit, wherein a first terminal of the power detector is coupled to the second terminal of the LNA, wherein the AGC circuit automatically controls a gain of the LNA according to an output of the power detector that generates an indication of a power level of the second single-ended RF signal, wherein the gain of the LNA is outputted to at least one eighth pin of the single chip.

4. The single chip of claim 3, wherein each of the second amplifier and the third amplifier is a buffer with a unity gain.

5. The single chip of claim 3, further comprising a power switch for powering on or powering down the single chip according to a control signal inputted from a ninth pin of the single chip.

6. The single chip of claim 3, wherein the single chip is connected to an external chip, wherein the external chip receives the first pair of differential RF signals, wherein the least one-eighth pin of the single chip is connected to at least one pin of the external chip.

7. The single chip of claim 5, wherein the single chip is connected to an external chip, wherein the external chip receives the first pair of differential RF signals, wherein the least one eighth pin of the single chip is connected to at least one pin of the external chip, and the ninth pin of the single chip is coupled to a pin of the external chip that outputs the control signal.

8. The single chip of claim 1, wherein the single chip is based on a CMOS process.

* * * * *